(12) United States Patent
McArdle et al.

(10) Patent No.: US 7,990,396 B2
(45) Date of Patent: Aug. 2, 2011

(54) METHOD FOR MAINTAINING PROJECT STANDARDS IN COMPUTER-AIDED DESIGN PROJECTS

(75) Inventors: Paul McArdle, Bow, NH (US); Scott Reinemann, Hooksett, NH (US)

(73) Assignee: Autodesk, Inc., San Rafael, CA (US)

( * ) Notice: Subject to any disclaimer, the term of this patent is extended or adjusted under 35 U.S.C. 154(b) by 159 days.

(21) Appl. No.: 11/340,175

(22) Filed: Jan. 26, 2006

(65) Prior Publication Data

US 2007/0186160 A1 Aug. 9, 2007

(51) Int. Cl.
*G06T 11/60* (2006.01)
*G09G 5/00* (2006.01)

(52) U.S. Cl. ....................................................... 345/630

(58) Field of Classification Search .................. 345/629, 345/630
See application file for complete search history.

(56) References Cited

U.S. PATENT DOCUMENTS

| 5,572,637 | A  | * | 11/1996 | Brown et al. ................. | 345/631 |
| 5,606,651 | A  | * | 2/1997  | Brown et al. ................. | 345/631 |
| 6,430,455 | B1 | * | 8/2002  | Rebello et al. ............... | 700/105 |
| 6,912,707 | B1 | * | 6/2005  | Fontes, Jr. .................... | 717/113 |
| 2004/0034842 | A1 | * | 2/2004 | Mantey et al. ................. | 716/15 |
| 2006/0136513 | A1 | * | 6/2006 | Ngo et al. ..................... | 707/203 |

OTHER PUBLICATIONS

How Paste Options works in Word 2002, Shauna Kelly, Oct. 21, 2002, 3 pages, http://web.archive.org/web/20021021042259/http://www.shaunakelly.com/word/styles/HowPasteOptionsWorks.html.*
How to use the Paste Options button in Excel, Dec. 10, 2004, 2 pages, http://web.archive.org/web/*/http://support.microsoft.com/kb/291358.*

* cited by examiner

*Primary Examiner* — Jeffrey A Brier
(74) *Attorney, Agent, or Firm* — Patterson & Sheridan, LLP

(57) ABSTRACT

Embodiments of the invention provide a CAD application that allows users to establish, maintain, and synchronize project standards for style definitions and display settings across multiple drawing files that are part of a design project. The CAD application also allows users to specify how changes to a project standard should be synchronized across the drawing files associated with a given design project. A synchronization setting may be manual, semi-automatic or automatic.

21 Claims, 8 Drawing Sheets

METHOD FOR MAINTAINING PROJECT STANDARDS IN COMPUTER-AIDED DESIGN PROJECTS

BACKGROUND OF THE INVENTION

1. Field of the Invention

The present invention generally relates to computer-aided design (CAD) applications. More specifically, the present invention relates to a method for synchronizing object style definitions used by multiple, discrete drawing files that are part of a design project.

2. Description of the Related Art

The term computer-aided design (CAD) generally refers to a broad variety of computer-based tools used by engineers, architects, and other design professionals. CAD applications may be used to construct computer models representing virtually any real-world construct. Commonly, CAD applications are used to create computer models of construction projects, e.g., residential homes, office buildings, roadways, bridges, etc. A model of such a project may be used to generate engineering and construction documents and to provide users with a visual display of the project such as a rendering of the interior design choices for a floor of a building.

Typically, a design project may include hundreds, if not thousands, of CAD drawing files, which may each provide a drawing or model of some aspect of the project. For example, a design project modeling an office building may include a drawing file for each floor of the building, for each building sub-system, and for the exterior design features. Further, each floor of the building may itself be represented by multiple drawing files, e.g., drawing files for individual offices, common areas, etc. Collectively, the CAD drawings provide a model of the different aspects of a design project from many different perspectives.

Using multiple, independent CAD drawings for a design project has several advantages. First, using many smaller files typically increases the performance of a CAD application, as the application does not have to parse a single monolithic project file to access some aspect of a drawing. Second, multiple users may edit different drawing files simultaneously.

To compose a CAD drawing, some CAD applications provide users with a catalog of drawing objects related to the architectural, engineering, and construction elements used in a particular project. Drawing objects are used to represent the geometry, shape, and location of an object within the CAD drawing. Drawing objects may also represent non graphical data such as data related to the manufacturer, fire resistance rating, schedule identification, etc of a component represented by a drawing object. The drawing objects allow a designer to compose a CAD drawing from objects that correspond to the components used to build the real-world structure, rather than from individual lines or geometric shapes. For example, a CAD drawing of a floor of an office building may include "wall" objects representing the exterior and interior walls and "door" objects to represent doors.

Further, some CAD applications allow users to define an object style that should be used for instances of a drawing object included in a CAD drawing. Generally, an object style refers to a set of parameters that define the appearance, function, or properties of a drawing object when it is used a CAD drawing. For example, a CAD application may provide a variety of door objects to represent different types of door constructions such as single-doors, double-doors, bi-fold doors, etc. Users may define an object style for aspects of these door objects such as the default frame dimensions, the hardware groups, the construction materials, or the display properties of the object such as a color or hatch pattern to use in screen displays or construction documents. Using object styles relieves the designer from having to repeatedly specify the same characteristics when including an instance of the drawing object in a CAD drawing. Once an object style is defined, it becomes part of the data associated with a CAD drawing. Thus, when the CAD drawing is shared with other users, the definition of an object style is always available. Also, changes to the object style defined for a given drawing object affect each instance of the drawing object included in a given CAD drawing.

As stated, using multiple drawing files has clear advantages. At the same time, when multiple CAD drawings are related to the same design project, the object styles within each CAD drawing may need to be synchronized with one another. For example, a given enterprise may desire to use the same object styles in all CAD drawings related to a particular design project. Coordinating different versions of an object style defined in multiple CAD drawings can be both difficult and time consuming, as the object style may have to be updated in each CAD drawing individually. Further, during the course of a design project, the project standards may change. Thus, a great deal of time and effort may be directed to coordinating object styles or to propagating changes made to the definition of an object style across a set of CAD drawings.

One approach to managing object styles is to have each CAD drawing reference an external definition for an object style. However, this approach creates a critical dependency on the externally defined object style and requires the definition to be available when any CAD drawing that references the externally defined object style is archived, transmitted, or opened by any user. Another approach is to provide a fixed collection of object styles to use in a design project. This approach, however, fails to allow users to create custom object styles for different design projects.

Accordingly, there remains a need for a way to establish, maintain and synchronize the definitions used for object styles and display settings across multiple CAD drawings associated with a design project.

SUMMARY OF THE INVENTION

Embodiments of the invention provide a mechanism for users to establish, maintain and synchronize object styles and display settings used in multiple CAD drawing associated with a design project.

One embodiment of the invention includes a method for synchronizing the definitions of object styles used by a plurality of CAD drawings associated with a design project. As stated, the definition of an object style may be used to specify the appearance, functions, or properties of a drawing object that may be included in a CAD drawing. Once defined, the object style may be associated with a version identifier. This way, different versions of an object style regarding the same drawing object may be distinguished from one another. The method generally includes receiving an indication of a project standard drawing containing a preferred object style definition to use in each CAD drawing associated with the design project. A designer designates the CAD drawing that includes the project standard version of the object style. Once designated, the preferred version of the object style within any CAD drawing associated with the design project may be synchronized with the version of the object style contained in the project standard drawings.

Synchronizing the definitions of object styles generally includes comparing the version identifier of the object style in the project standard drawing with the version identifier of the object style in a CAD drawing associated with the design project. If the versions of the object styles are different, the definition of the object style in the project standard drawing may replace the object style definition in the CAD drawing. However, the reverse may also occur, the version of the object style in the CAD drawing may be used to replace the version in the project standard drawing, thereby becoming the preferred version of the object style. This may occur when the version in the drawing is newer than the version in the project standard drawing. Synchronizing project standards may occur in a manual, semi-automatic, or automatic manner.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENTS

Embodiments of the invention allow users to establish, maintain and synchronize object style definitions and display settings used in multiple CAD drawings associated with a common design project. As stated, an object style refers to a set of parameters that define the appearance, function, or properties of a drawing object used in a CAD drawing. In one embodiment, the object style definitions in a CAD drawing are synchronized with a preferred version of the object style definitions in a project standards drawing. Additionally, a user may specify how the object style definition in a project standard drawing should be synchronized with other CAD drawings associated with the design project. A synchronization setting may specify that object style definitions should be synchronized in a manual, semi-automatic, or automatic manner.

To facilitate a description of the present invention, the following discussion describes an embodiment of a CAD application used to model a construction project of an office building. Accordingly, aspects of the CAD application are described in reference to drawing objects such as walls, doors, and other features one would expect to be present in such a design project. However, embodiments of the invention may be applied to CAD applications that allow users to define object styles for drawing objects used to compose computer-generated models of any other type of entity or object.

Figure 1:
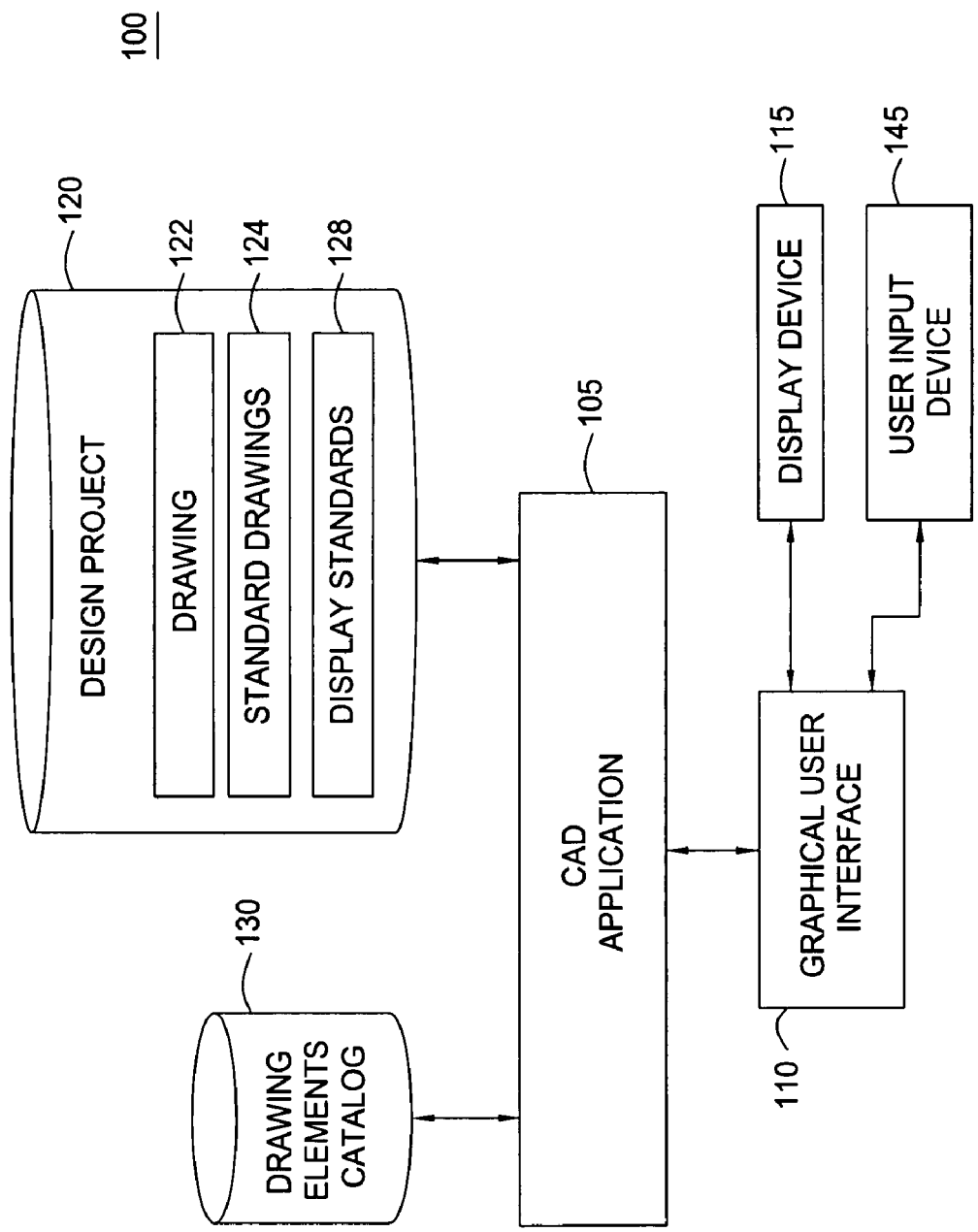
FIG. 1 is a block diagram illustrating a computer-aided design (CAD) application environment, according to one embodiment of the invention.

FIG. 1 is a block diagram illustrating a computer-aided design (CAD) application environment 100, according to one embodiment of the invention. As shown, the CAD environment 100 includes, without limitation, a CAD application program 105, a graphical user interface 110, design project 120, user input devices 145, a display device 115, and a drawing elements catalog 130.

The environment 100 illustrated in FIG. 1 may include software applications and associated data files configured for existing computer systems, e.g., desktop computers, server computers, laptop computers, tablet computers, and the like. The components illustrated in environment 100, however, are not limited to any particular computing environment, programming language, or computer hardware and/or software combination, and embodiments of the invention may be adapted to take advantage of new computing systems as they become available.

Additionally, the components illustrated in FIG. 1 may be deployed on individual computer systems or on distributed systems configured to communicate over computer networks ranging from small local area networks to large wide area networks such as the Internet. For example, the CAD application 105 may include a client component executing on one computer system that communications with a server component executing on another computer system.

The CAD application 105 provides a computer program that allows users to create, edit, and view any of the files associated with a design project 120. For a project related to the architecture, engineering, or design of a construction project, the Architectural Desktop and Autodesk Building Systems program suite available from Autodesk®, Inc. may be used. As shown, the design project 120 includes CAD drawings 122, project standards drawings 124, and display standards 128. Drawings 122 represent the collection of drawings, drawing templates, models, images, and data generated during the course of a design project. Accordingly, each drawing file may provide a computer-generated drawing, figure, or schematic regarding some aspect of the project being modeled by design project 120.

The catalog 130 provides users with a set of drawing objects available for constructing a drawing 122 using CAD application 105. Typically, drawing catalog 130 includes drawing objects that represent components of the object being modeled by design project 120. For example, drawing objects used for a design project 120 representing a commercial office building would include objects corresponding to doors, walls, lighting, fixtures, etc. Additionally, an individual drawing object may itself be a composite of multiple objects. For example, a wall object may be defined as composite of an interior construction object and a finishing surface object, along with attributes such as paint type and color. Similarly, a curtain wall object may be defined as composite of a curtain wall layout geometry that includes doors and windows, along with attributes such as glazing type, frame paint type and color.

As stated, a given drawing 122 may define one or more styles characterizing instances of a drawing objects within the drawing 122. For example, an object style for a wall may be defined that specifies a wall object that includes an interior construction using wood studs, a finishing surface using gypsum wallboard, and values for the paint type and color attributes. Instances of a wall using this style may then be included in a drawing 122 without the user having to specify these aspects of the wall object; instead, these aspects are part of the wall object style. More generally, object styles may be used to define any attribute or characteristic associated with the object. Thus, an object style may define physical characteristics of the object such as the various component sizes, material, weight, length, diameter, etc., and an object style may also define attributes of an object such as manufacturer, costs, suppliers, etc.

Once a style is defined for an object or drawing element, the definition may be stored with a drawing 122, and different drawings may include the different object styles for the same drawing objects. In one embodiment, the CAD application 105 may be configured to synchronize the object style definitions used by drawings 122 that are part of the same design project 120. The user selects a version to use as the standard object style for a design project 120 and designates the drawing that includes the preferred object style as a project standard drawing 124. The version of an object style used by any drawing 122 that is part of a design project 120 may then be synchronized with the preferred version of the object style contained in the project standard drawings 124.

In one embodiment, users indicate which object styles in a standard drawing 124 should be used as the standard versions of object styles for a given project. This allows the versions of certain object styles defined in one project standard drawing 124 to be used as the standard version (e.g., wall and door object styles) and the version of object styles defined in another standards drawing 124 to be used as the standard version for another object type (e.g., fixtures and lighting).

Returning to the components illustrated in FIG. 1, the graphical user interface 110 may provide GUI elements (e.g. menus, buttons, drop-down lists, check-boxes, etc.) that allow a user to manipulate any of the drawings 122, standards drawings 124, or display standards 128. Display device 115 provides users with a visual representation of a drawing file 122. Input devices 145 allow a user to interact with the 3D model 120 and GUI interface 110. User input devices 145 may include a mouse pointing device and a keyboard, and display device 115 may include a CRT monitor or LCD display.

Figure 2:
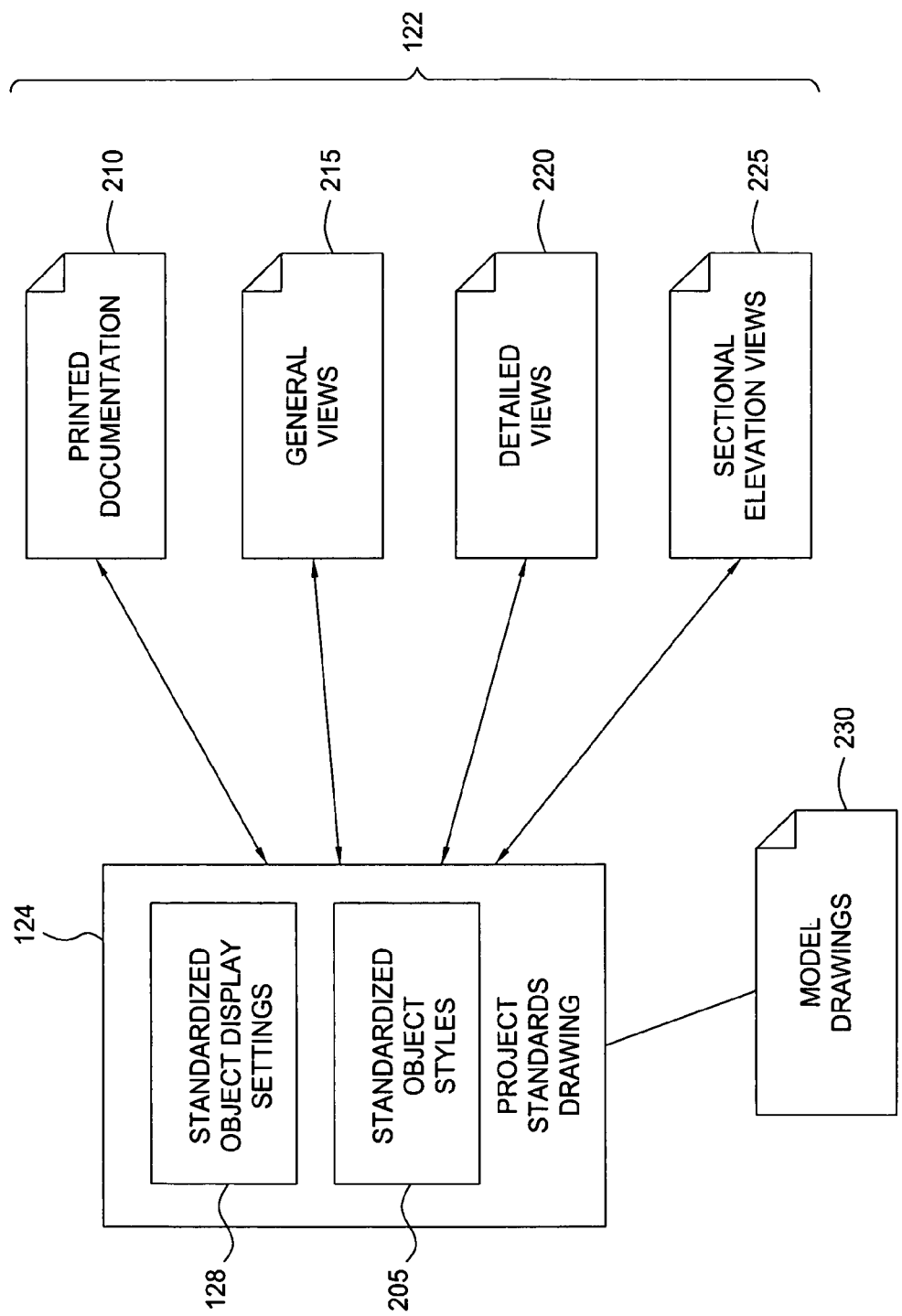
FIG. 2 is a block diagram illustrating the relationship between a project standards drawing and other drawing files that may be generated over the course of a CAD design project, according to one embodiment of the invention.

The CAD application 105 may generate a variety of views or graphical representations of the design project 120 displayed on display device 115, as well as to generate 2D engineering and construction documentation. For example, FIG. 2 illustrates common types of CAD drawings 122 that may include object styles to use for drawing objects included in the particular CAD drawing 122. In one embodiment, the project standards drawings 124 define the standard version of object styles 205 to be used across all of the drawings 122 that are part of a design project 120. As shown, the version of object styles 205 in a project standard drawing 124 may be synchronized with the version used in variety of CAD drawings including, without limitation, printed documentation 210, general two- or three-dimensional views 215, detailed views 220, cross sectional or elevation views 225, model drawings 230, etc.

In one embodiment, project standards 124 for object styles and display settings may be synchronized with the drawings 122 during a manual, semi-automatic, or automatic synchronization process. As described, an object style may include values for a set of parameters that define the appearance, functions, or properties of an object or drawing element in a drawing. In order to synchronize the version of an object style 205 with the version in a project standard drawing 124, the values for these properties should be synchronized. In one embodiment, a version identifier is used to determine whether the definition of an object style in a CAD drawing 122 is different from the version used by a project standard drawing 124. When the definition of an object style in a CAD drawing 122 is modified, the version identifier of the style is updated.

During object style synchronization, the version identifiers for objects styles in a drawing 122 are compared with the version identifiers for the object styles in the project standards drawings 124. If the version identifiers do not match, then a user may decide how to synchronize the object style. For example, the user may be presented with a list of objects styles in a CAD drawing 122 that need to be synchronized with the version defined in a project standard drawing 124. In one embodiment, the user may select individual object styles to synchronize. To synchronize the version of an object style in a CAD drawing 122 with the version in the project standard drawing 124, the definition of the object styles from the project standard drawing 124 are used to overwrite the definition of the object styles in the CAD drawing 122. Alternatively, the user may select to change the definition of an object style in the project standard drawing. In such a case, the definition of the object style in the project standard drawing is replaced with the definition of the object style in the drawing 122.

Additonally, the CAD application 105 may allow users to ignore a given synchronization mismatch. Thus, a user may decide to allow some object styles to remain different from the version in the project standard drawing 124. Alternatively, for an automatic synchronization process, when the version identifiers for an object style in a drawing 122 and a project standards drawings 124 are different from one another, the CAD application 105 may automatically update the version in the drawing 122, or may automatically select the newest version of the object style to use as the version in the project standard drawing 124.

Figure 3:
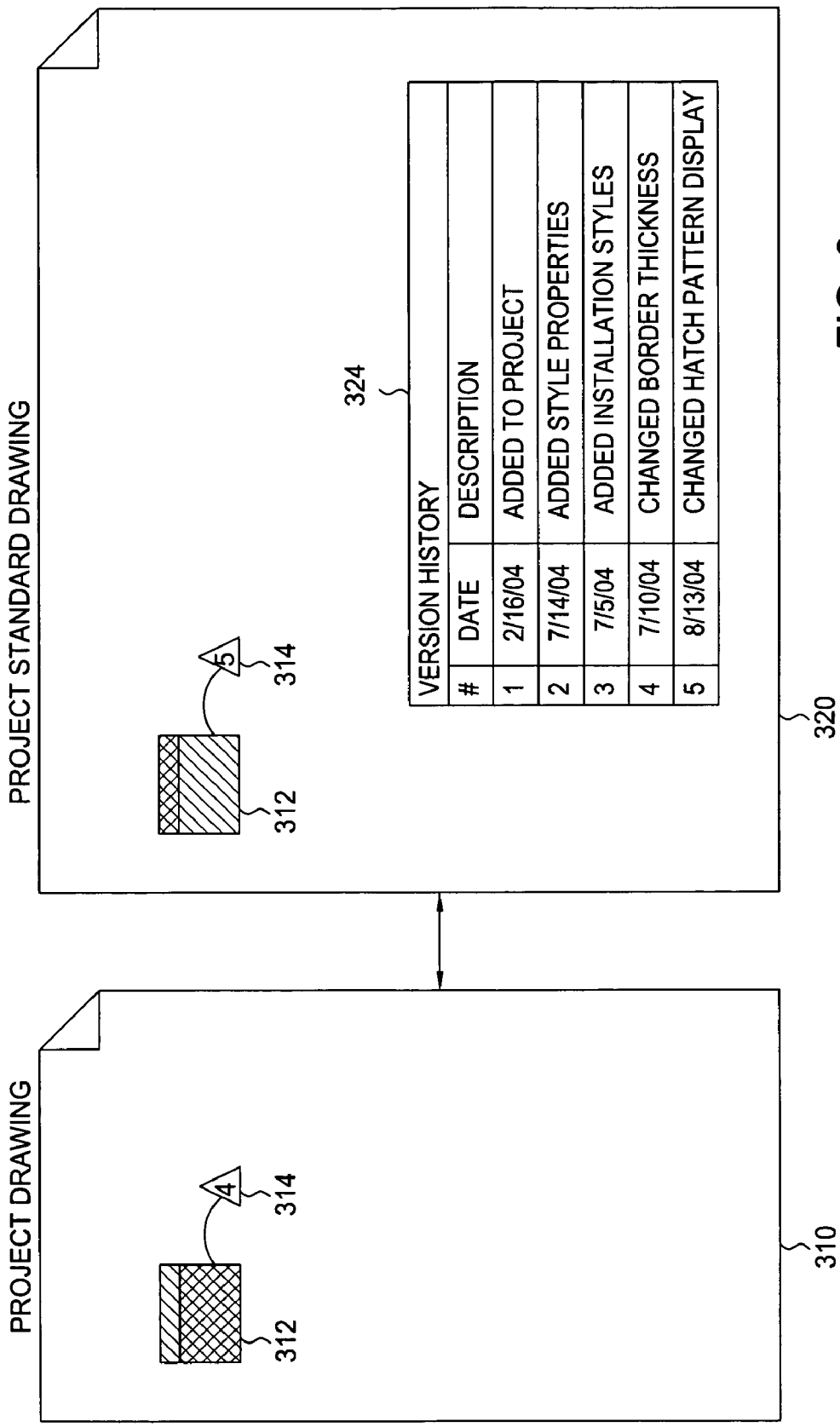
FIG. 3 is a block diagram illustrating the relationship between a version of an object style in a project standards drawing and a version of the object style in other drawing files, according to one embodiment of the invention.

FIG. 3 illustrates the relationship between a version of an object style in CAD drawing 310 and a version of the object style in a project standard drawing 320. As shown, CAD drawing 310 includes an instance of a drawing object 312. The drawing object 312 includes an object style that uses two hatch patterns. Associated with the drawing object 312 is a version identifier 314 for this object style. Illustratively, the version of the object style used to display the drawing object 312 in the CAD drawing 310 is "4."

Project standard drawing 320 includes drawing object 312 and version history table 324. The version history table 324 may be stored for each object style defined in a standard drawing 320. In one embodiment, version information may include a version identifier, the date/time the object style was last modified, an indication of the user that last modified the object style and a comment describing the changes from one version to the next. The version identifier may be used to determine whether an object style defined in a CAD drawing 122 matches the definition of the object style defined in a project standard drawing 124.

As shown, the version history table includes 5 entries, with the version identified by the version identifier "5" being the current standard version for the object style that should be used for drawing object 312. Illustratively, the version "5" for this drawing object reverses the hatching patterns from version "4" of the object style shown in CAD drawing 310. Thus, the object style used for drawing element 312 in the CAD drawing 310 does not match the standard for the object style in project standard drawing 320. When object styles in project drawing 310 are synchronized with the object styles in the project standard drawing 320, the object style for drawing object 312 in CAD drawing 310 may be overwritten to use version "5" of the object style.

In one embodiment, multiple standards drawings 124 may be used to designate the object styles that should be used in CAD drawings 122. In such a case, the CAD application 105 may determine which standard drawing 124 to use according to a hierarchy of the project standards drawings 124 specified in the interface 110. For example, a design firm may have a default set of object styles to use for any design project 120. At the same time, a particular client or particular project may have its own set of object styles. In such a case, the design firm may specify that the object styles provided by particular client should be used to synchronize object styles in multiple CAD drawings 122, and to otherwise use a default set object styles defined by the design firm.

Figure 4:
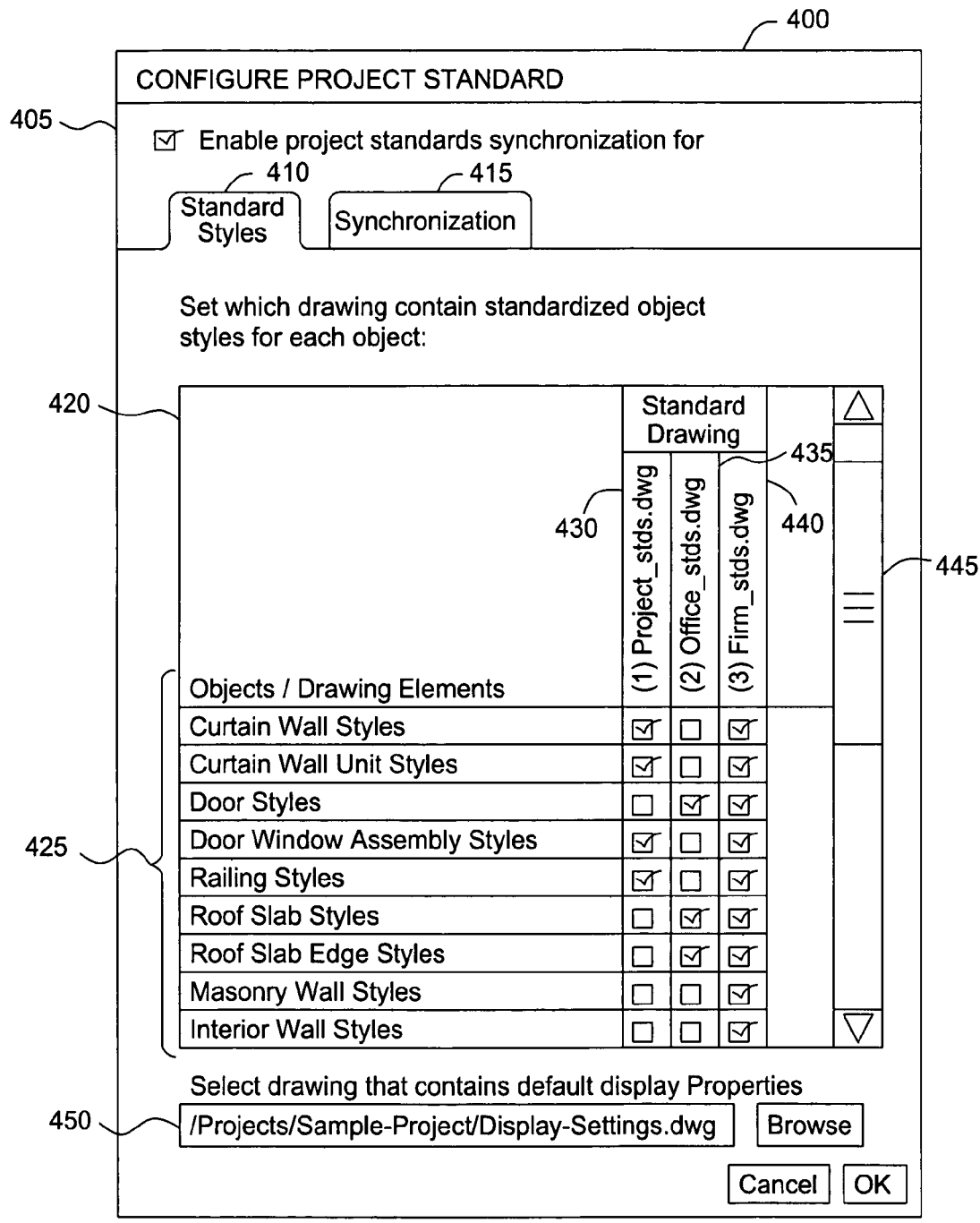
FIG. 4 illustrates an exemplary dialog box for specifying a hierarchy of project standards drawings to define object styles used for a CAD design project, according to one embodiment of the invention.

FIG. 4 illustrates an exemplary dialog box 400 for specifying a hierarchy of project standards drawings 124 defining the object styles to use for a CAD design project 120 during project synchronization. As shown, dialog box 400 includes a checkbox 405 for enabling object style synchronization. Additionally, dialog box 400 includes a standard styles tab 410 and synchronization tab 415.

Illustratively, the standard styles tab 410 is selected and dialog box 400 displays a panel 420 for specifying which standard drawing to use for a variety of different object styles. As shown, a user has chosen to use object style definitions from three standards drawings. Specifically, the definitions of object styles contained project_stds.dwg 430, office_stds-.dwg file 435, or firm_stds.dwg file 440 may be designated as the standard version. By checking the cell for a given object style type and one of standards drawing 430, 435, and 440 a user may define which standards drawing contains the standard definition of an object style that should be used by all CAD drawings 122 associated with a design project. If more than one of standards drawing 430, 435, and 440 is selected, then the CAD application will search through each selected project standard drawing 124 until finding a style for the specified object type during the synchronization process. Object style list 425 displays the available drawing objects for which project standardized styles may be defined. More styles on the list may be displayed using the graphical slider bar 445.

In one embodiment, dialog box 400 may also allow users to specify a display properties file 450 for a design project 120. The default display properties may specify elements such as color, line style, font, font size, font selection, etc., to use in generating drawing displays or documentation from CAD drawings 122.

Figure 5:
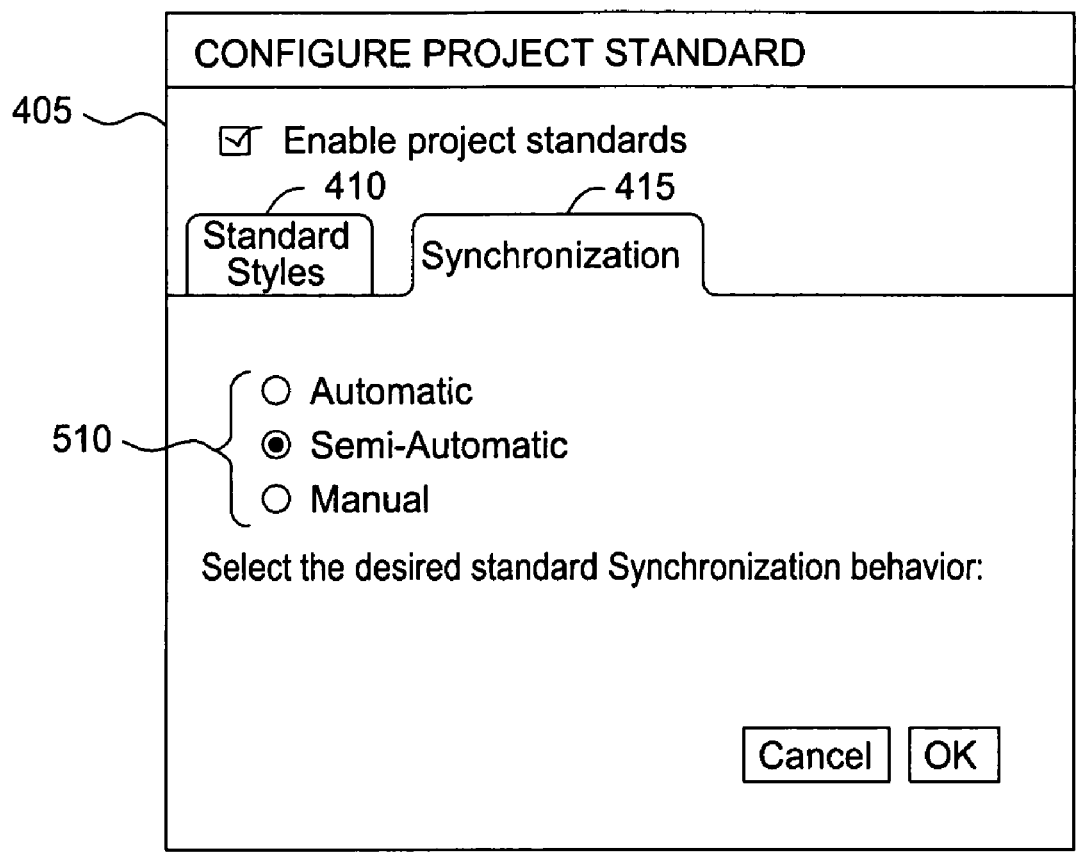
FIG. 5 further illustrates the exemplary dialog shown in FIG. 4, according to one embodiment of the invention.

FIG. 5 further illustrates the dialog box 400 shown in FIG. 4, according to one embodiment of the invention. Illustratively, FIG. 5 shows the dialog box 400 with the synchronization tab 415 selected and dialog box 400 displays radio buttons 510 that allow a user to select how the object styles used by CAD drawings 122 are synchronized with the definitions of object styles in project standard drawings 124. Synchronization setting 510 may be set using the radio buttons displayed in box 400. In one embodiment, the synchronization setting includes automatic, semi-automatic, and manual synchronization. The actions of the CAD application 105 regarding the synchronization of project standards across the drawings 122 in a design project depends on the synchronization type specified for the design project. The operations of manual, semi-automatic, and automatic synchronization are further described below in reference to FIGS. 6-8.

Figure 6:
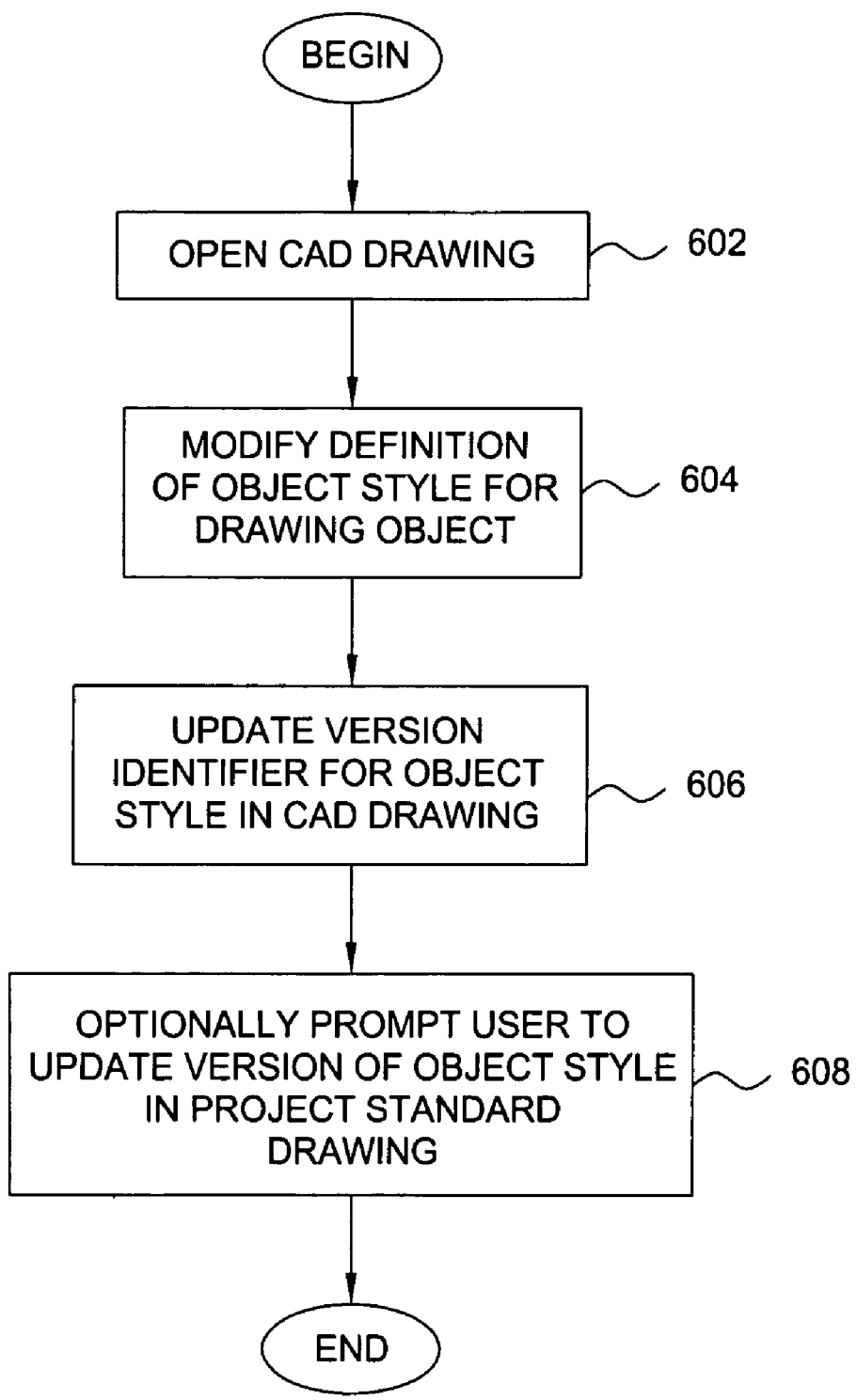
FIG. 6 is a flow diagram illustrating a method for modifying the definition of an object style in a CAD drawing associated with a design project, according to one embodiment of the invention.

FIG. 6 is a flow diagram illustrating a method 600 for modifying the definition of an object style in a CAD drawing associated with a design project, according to one embodiment of the invention. Persons skilled in the art will understand that any system configured to perform the method steps illustrated in FIG. 6, in any order, is within the scope of the present invention.

The method begins at step 602 when a user selects to open a CAD drawing 122 associated with a design project 120. At step 604, the user modifies the definition of an object style for a drawing object included in the drawing 122.

At step 606, the CAD application updates the version of the object style associated with the CAD drawing 122. For example, as shown in FIG. 3, the version identifier for the object style associated with drawing object 312 in drawing 310 is "4." If the user modifies the object style associated with the drawing object 312 in drawing 310, then the value of the version identifier may be updated. Although shown using simple integers, the version identifier may be assigned using a numbering scheme such as a 32 character GUID value.

In one embodiment, the user may be prompted to update the version for the object style when changes to the object style are made. Alternatively, the version may be updated automatically, or when the user manually selects to "version" the object styles used by drawing objects in a CAD drawing 122. The behavior in a given instance may depend on the synchronization settings 510. Optionally, at step 608, the CAD application 105 may prompt the user to update the object style in the project standards for the design project 120. For example, if the synchronization type for the project is semi-automatic, then the CAD application 150 may prompt the user with a dialog box asking whether the modified object style in the CAD drawing 122 should be used to overwrite the definition of the object style in project standards 124.

Alternatively, if the synchronization type is set to manual, then once the version is updated, the method 600 terminates without prompting the user to propagate the modified style to the project standards 124. For automatic synchronization, no prompting is necessary, and the modified version of the object style is automatically propagated from the drawing 122 into the project standards 124.

Figure 7:
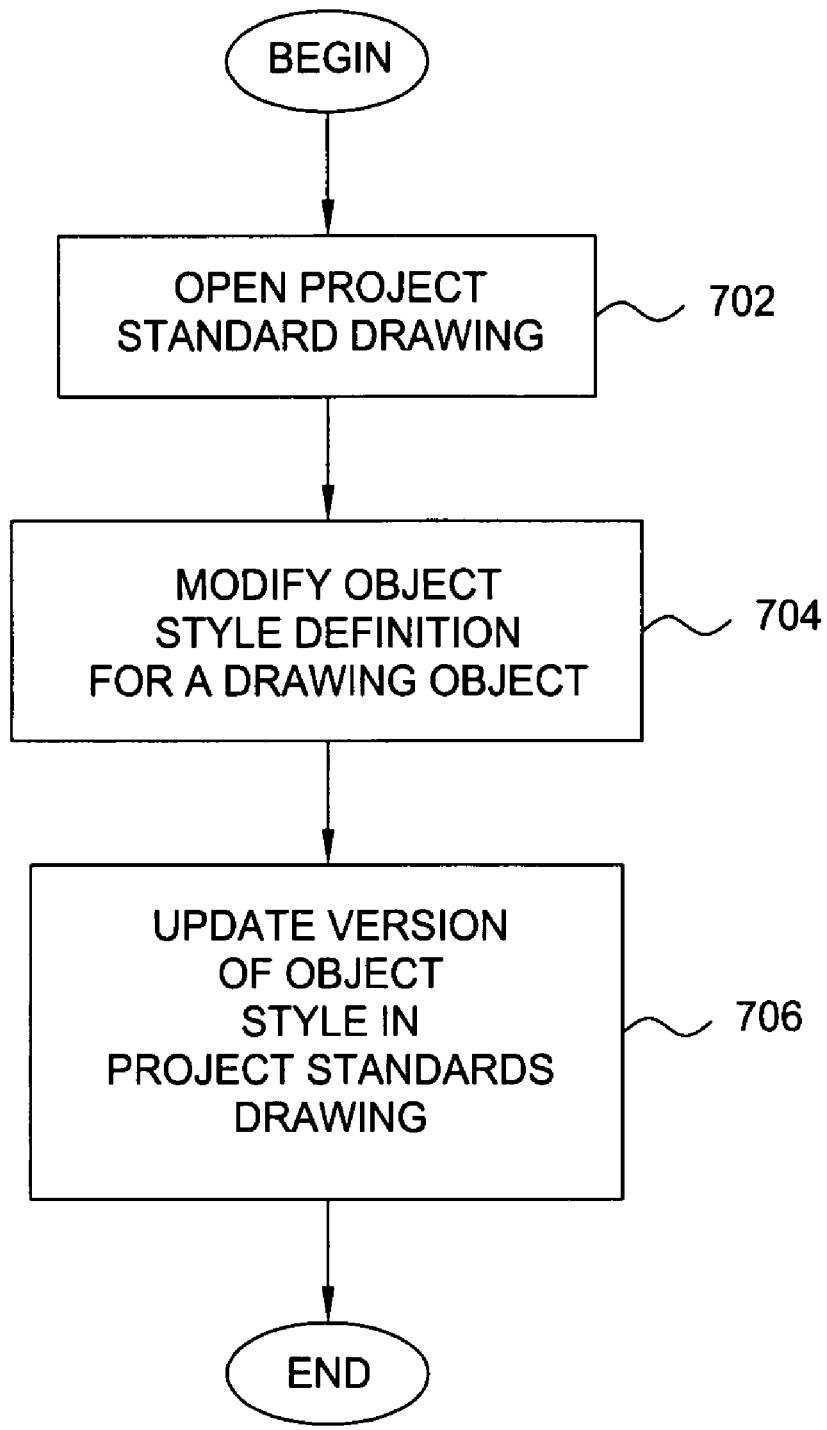
FIG. 7 is a flow diagram illustrating a method for modifying an object style definition in a, project standards drawing according to one embodiment of the invention.

FIG. 7 illustrates a flow diagram illustrating a method 700 for modifying an object style definition defined in a project standard drawing 124, according to one embodiment of the invention. Persons skilled in the art will understand that any system configured to perform the method steps illustrated in FIG. 7, in any order, is within the scope of the present invention.

The method 700 begins at step 702 where a user selects to open a project standard drawing 124. At step 704, the user modifies the definition of an object style for a drawing object included in the drawing 124. For example, as shown in FIG. 3, the version of drawing element 312 in the project standard drawing 320 is "5." If the user modifies the object style associated with drawing object 312, then the value for the version may be updated accordingly.

At step 706, after modifying the object style for a drawing object, the version associated with the object style is updated in the project standards drawing 124. It should be noted however, modifying the project standards drawing 124 alone may not cause the version of the object style to be synchronized across CAD drawings 122. Instead, depending on the synchronization settings 510, different actions may occur. For example, if the synchronization setting 510 is set to manual, then the object style in a particular drawing 122 is updated to the new version specified in the project standard, only when the user manually selects to synchronize a particular drawing 122 against the project standards 124. Alternatively, for semi-automatic synchronization, any time a user opens a drawing 122 associated with a design project 120, the CAD application may synchronize the definitions of object styles in the CAD drawing 122 by comparing the version identifier for object styles in the CAD drawing 122 with the version in the standards drawing 124. Any object style versions that do not match the version identified in project standards 124 may then be updated as directed by the user. For fully automatic synchronization, anytime a project drawing is opened, the object style definitions in a CAD drawing 122 may be synchronized with the definitions specified in the project standard drawings 124, without further user interaction. The actions performed in a particular case may depend on synchronization settings 510.

Figure 8:
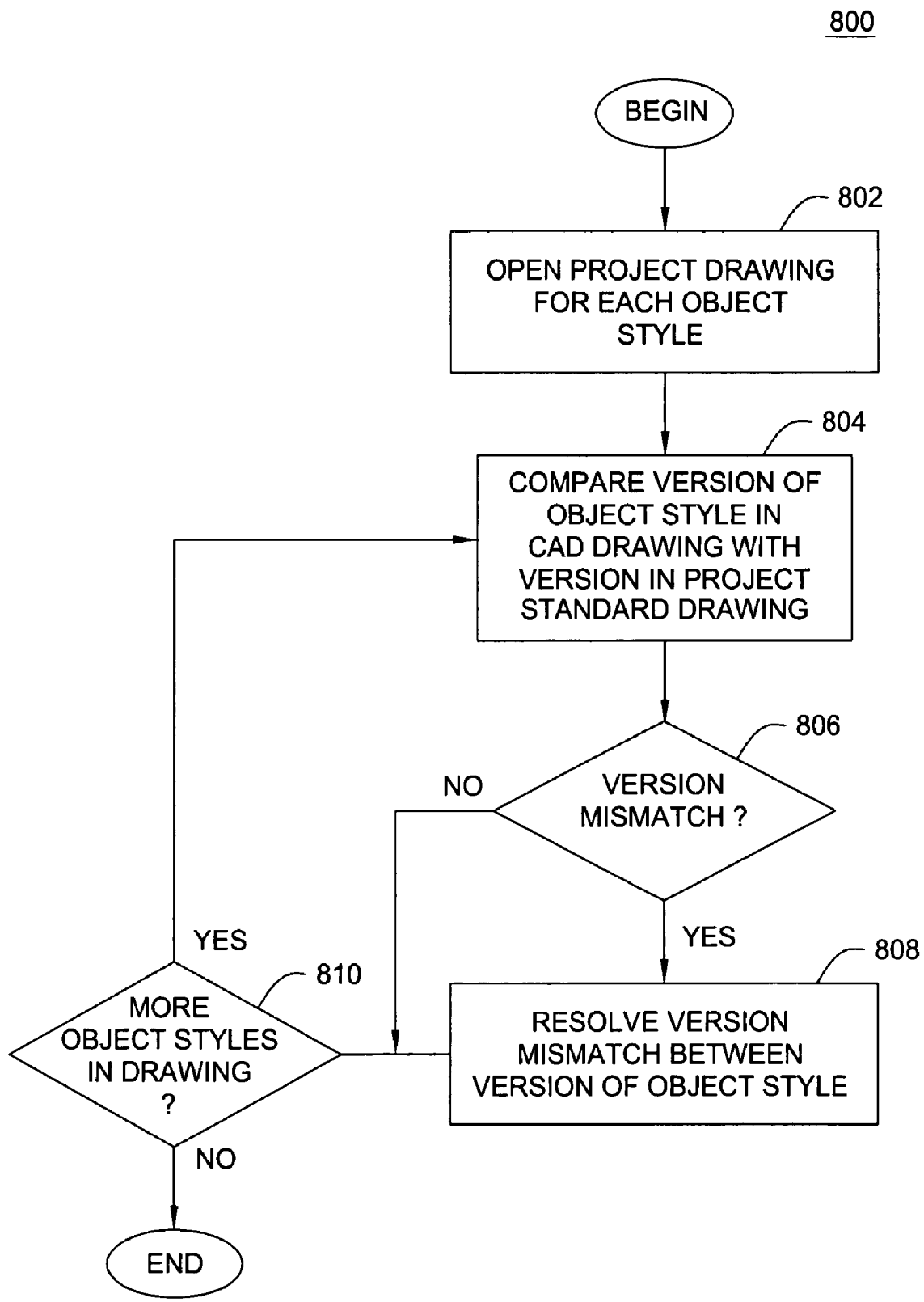
FIG. 8 illustrates a method for synchronizing object style definitions used by multiple, discrete drawing files that are part of a design project, according to one embodiment of the invention.

FIG. 8 illustrates a method for synchronizing the definitions of object styles definitions contained in a CAD drawing 122 that are part of a design project 120 with the versions in a project standard drawing 124, according to one embodiment of the invention. Persons skilled in the art will understand that any system configured to perform the method steps illustrated in FIG. 8, in any order, is within the scope of the present invention.

The method begins at step 802 where a user selects a CAD drawing 122 to have object style definitions synchronized with the definitions in project standards 124. At step 804, the CAD application 105 compares the version identifier associated with an object style definition in the selected CAD drawing 122 with the version identifier for the object style contained in a project standard drawing 124. At step 806, if the version identifiers do not match, then at step 808 the CAD application may overwrite the definition of the object style in the CAD drawing 122 with the definition from the project standards. Alternatively, the CAD application may prompt a user to specify how to resolve the mismatch between the object style in CAD drawing 122 and the standards drawing 124. At step 810, if more object styles exist in the drawing, then the process of comparing versions continues for each object style in the drawing 122.

In addition to the synchronization features described above, embodiments of the invention may be used to audit the state of a given design project and to generate auditing and synchronization reports. Auditing a project drawing 122 or a design project 120 against the project standards 124 may generate a report containing a list of objects style definitions in the project drawing 122 with old (previous) versions, non-standard (newer) versions, or object styles for which no project standard exits. When the project standards audit is executed, the user will be prompted for a filename to save the audit report.

In addition, when synchronization events occur, the CAD application 105 may create a log to record which object styles definitions are synchronized from one drawing to another. If an object style definition for a drawing object is synchronized (or expressly skipped from synchronization in response to user input) the log includes the name of CAD drawing 122, the object style synchronized (or not synchronized), the date the object style definition was modified date, user names and comments, etc.

Using object styles relieves the designer from having to repeatedly specify the same characteristics when including an instance of the drawing object in a CAD drawing 122. However, when a design project includes hundreds, or thousands, of CAD drawings, coordinating a consistent set of object styles can be both difficult and time consuming. Embodiments of the invention allow users to synchronize the definitions of object styles across such CAD drawings automatically, and further, allow the preferred definition of the object style used for synchronization to change, over time.

While the foregoing is directed to embodiments of the present invention, other embodiments of the invention may be devised without departing from the basic scope thereof, and the scope thereof is determined by the claims that follow.

What is claimed is:

1. A computer-implemented method for updating a definition of an object style included in each of a plurality of computer-aided design (CAD) drawings generated by a CAD application executing on a computer system, the method comprising:
    receiving a selection of a project standard drawing, selected from the plurality of CAD drawings, which includes a preferred object style definition to use in each of the plurality of CAD drawings, wherein the preferred object style definition defines the appearance, functions, or properties of a drawing object that corresponds to physical characteristics of a real-world object;
    comparing the preferred object style definition included in the project standard drawing with a definition of the object style included in each of the plurality of CAD drawings, wherein different object styles are used for the same drawing object in the plurality of CAD drawings;
    determining, from the comparison, that the definition of the object style included in at least a first CAD drawing does not match the preferred object style definition included in the project standard drawing;
    prompting a user to specify how to resolve a mismatch between the definition of the object style included in the first CAD drawing and the preferred object style definition included in the project standard drawing;
    synchronizing the definition of the object style included in the first CAD drawing with the preferred object style definition included in the project standard drawing by, based on the user specification of how to resolve the mismatch, replacing the definition of the object style included in the first CAD drawing with the preferred object style definition included in the project standard drawing to produce an updated definition of the object style; and
    displaying a graphical representation of the updated first CAD drawing on a display device.

2. The method of claim 1, wherein comparing the preferred object style definition included in the project standard drawing with the definition of the object style included in each of the plurality of CAD drawings comprises, comparing an identifier associated with the preferred object style definition with an identifier associated with the definition of the object style included in each of the plurality of CAD drawings.

3. The method of claim 1, wherein the step of synchronizing the definition of the object style included in the first CAD drawing with the preferred object style definition included in the project standard drawing occurs in response to the user initiating a synchronization process.

4. The method of claim 1, wherein the preferred object style definition included in the project standard drawing is synchronized with the definition of the object style included in the first CAD drawing each time the user accesses the first CAD drawing.

5. The method of claim 1, further comprising the step of choosing the project standard drawing based on a hierarchy of project standard drawings prior to the step of receiving a selection of a project standard drawing including the preferred object style definition to use in each of the plurality of CAD drawings.

6. The method of claim 1, wherein the preferred object style definition defines attributes of the drawing object including a manufacturer and costs.

7. The method of claim 1, further comprising the steps of:
   determining that the definition of the object style included in a second CAD drawing does not match the preferred object style definition included in the project standard drawing;
   presenting a list of objects styles in the second CAD drawing that are not synchronized with the project standard drawing;
   receiving a change of a definition of the object style in the project standard drawing, selected by the user from the list of object styles; and
   synchronizing the definition of the object style included in the second CAD drawing with the preferred object style definition included in the project standard drawing by replacing the definition of the object style included in the project standard drawing with the preferred object style definition included in the first CAD drawing to produce the updated definition of the object style.

8. A computer-readable storage medium that includes instructions that when executed by a processor, performs an operation for updating a definition of an object style included in each of a plurality of computer-aided design (CAD) drawings generated by a CAD application executing on a computer system, including the steps of:
   receiving a selection of a project standard drawing, selected from the plurality of CAD drawings, which includes a preferred object style definition to use in each of the plurality of CAD drawings, wherein the preferred object style definition defines the appearance, functions, or properties of a drawing object that corresponds to physical characteristics of a real-world object;
   comparing the preferred object style definition included in the project standard drawing with a definition of the object style included in each of the plurality of CAD drawings, wherein different object styles are used for the same drawing object in the plurality of CAD drawings;
   determining, from the comparison, that the definition of the object style included in at least a first CAD drawing does not match the preferred object style definition included in the project standard drawing;
   prompting a user to specify how to resolve a mismatch between the definition of the object style included in the first CAD drawing and the preferred object style definition included in the project standard drawing;
   synchronizing the definition of the object style included in the first CAD drawing with the preferred object style definition included in the project standard drawing by, based on the user specification of how to resolve the mismatch, replacing the definition of the object style included in the first CAD drawing with the preferred object style definition included in the project standard drawing to produce an updated definition of the object style; and
   displaying a graphical representation of the updated first CAD drawing on a display device.

9. The computer-readable storage medium of claim 8 wherein comparing the preferred object style definition included in the project standard drawing with the definition of the object style included in each of the plurality of CAD drawings comprises, comparing an identifier associated with the preferred object style definition included in the project standard drawing with an identifier associated with the definition of the object style included in each of the plurality of CAD drawings.

10. The computer-readable storage medium of claim 8 wherein the step of synchronizing the definition of the object style included in the first CAD drawing with the preferred object style definition included in the project standard drawing occurs in response to the user initiating a synchronization process.

11. The computer-readable storage medium of claim 8 wherein the preferred object style definition included in the project standard drawing is synchronized with the definition of the object style included in the first CAD drawing each time the user accesses the first CAD drawing.

12. The computer-readable storage medium of claim 8, further comprising the step of choosing the project standard drawing based on a hierarchy of project standard drawings prior to the step of receiving a selection of a project standard drawing-including the preferred object style definition to use in each of the plurality of CAD drawings.

13. The computer-readable storage medium of claim 8, wherein the preferred object style definition defines attributes of the drawing object including a manufacturer and costs.

14. The computer-read0able storage medium of claim 8, further comprising the steps of:
   determining that the definition of the object style included in a second CAD drawing does not match the preferred object style definition included in the project standard drawing;
   presenting a list of objects styles in the second CAD drawing that are not synchronized with the project standard drawing;
   receiving a change of a definition of the object style in the project standard drawing, selected by the user from the list of object styles; and
   synchronizing the definition of the object style included in the second CAD drawing with the preferred object style definition included in the project standard drawing by replacing the definition of the object style included in the project standard drawing with the preferred object style definition included in the first CAD drawing to produce the updated definition of the object style.

15. A computing device comprising:
   a processor; and
   a memory configured to store an application that includes instructions which, when executed by the processor, cause the processor to perform operations for updating a definition of an object style-included in each of a plurality of computer-aided design (CAD) drawings generated by a CAD application executing on a computer system, including the steps of:
   receiving a selection of a project standard drawing, selected from the plurality of CAD drawings, which includes a preferred object style definition to use in each of the plurality of CAD drawings, wherein the preferred object style definition defines the appearance, functions, or properties of a drawing object that corresponds to physical characteristics of a real-world object;
   comparing the preferred object style definition included in the project standard drawing with a definition of the object style included in each of the plurality of CAD drawings, wherein different object styles are used for the same drawing object in the plurality of CAD drawings;

determining, from the comparison, that the definition of the object style included in at least a first CAD drawing does not match the preferred object style definition-included in the project standard drawing;

prompting a user to specify how to resolve a mismatch between the definition of the object style included in the first CAD drawing and the preferred object style definition included in the project standard drawing;

synchronizing the definition of the object style included in the first CAD drawing with the preferred object style definition included in the project standard drawing by, based on the user specification of how to resolve the mismatch, replacing the definition of the object style included in the first CAD drawing with the preferred object style definition included in the project standard drawing to produce an updated definition of the object style; and displaying a graphical representation of the updated first CAD drawing on a display device.

16. The computing device of claim 15, wherein comparing the preferred object style definition included in the project standard drawing with the definition of the object style included in each of the plurality of CAD drawings comprises, comparing an identifier associated with the preferred object style definition included in the project standard drawing with an identifier associated with the definition of the object style included in each of the plurality of CAD drawings.

17. The computing device of claim 15, wherein the step of synchronizing the definition of the object style included in the first CAD drawing with the preferred object style definition included in the project standard drawing occurs in response to the user initiating a synchronization process.

18. The computing device of claim 15 wherein the preferred object style definition included in the project standard drawing is synchronized with the definition of the object style included in the first CAD drawing each time the user accesses the first CAD drawing.

19. The computing device of claim 15, further comprising the step of choosing the project standard drawing based on a hierarchy of project standard drawings prior to the step of receiving a selection of a project standard drawing-including the preferred object style definition to use in each of the plurality of CAD drawings.

20. The computing device of claim 15, wherein the preferred object style definition defines attributes of the drawing object including a manufacturer and costs.

21. The computing device of claim 15, further comprising the steps of:

determining that the definition of the object style included in a second CAD drawing does not match the preferred object style definition included in the project standard drawing;

presenting a list of objects styles in the second CAD drawing that are not synchronized with the project standard drawing;

receiving a change of a definition of the object style in the project standard drawing, selected by the user from the list of object styles; and synchronizing the definition of the object style included in the second CAD drawing with the preferred object style definition included in the project standard drawing by replacing the definition of the object style included in the project standard drawing with the preferred object style definition included in the first CAD drawing to produce the updated definition of the object style.

* * * * *

UNITED STATES PATENT AND TRADEMARK OFFICE
CERTIFICATE OF CORRECTION

| | | |
|---|---|---|
| PATENT NO. | : 7,990,396 B2 | |
| APPLICATION NO. | : 11/340175 | |
| DATED | : August 2, 2011 | |
| INVENTOR(S) | : Paul McArdle and Scott Reinemann | |

It is certified that error appears in the above-identified patent and that said Letters Patent is hereby corrected as shown below:

Column 12, line 30, Claim 14 replace "computer-read0able" with --computer-readable--.

Signed and Sealed this
Eighteenth Day of October, 2011

David J. Kappos
*Director of the United States Patent and Trademark Office*